United States Patent
Jairam et al.

(10) Patent No.: US 7,526,694 B1
(45) Date of Patent: Apr. 28, 2009

(54) INTEGRATED CIRCUIT INTERNAL TEST CIRCUIT AND METHOD OF TESTING THEREWITH

(75) Inventors: Prabha Jairam, Fremont, CA (US); Himanshu J. Verma, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 352 days.

(21) Appl. No.: 11/498,368

(22) Filed: Aug. 3, 2006

(51) Int. Cl.
*G01R 31/28* (2006.01)
*G06F 17/50* (2006.01)

(52) U.S. Cl. .......................................... 714/725; 716/4
(58) Field of Classification Search ........................ None
See application file for complete search history.

(56) References Cited

U.S. PATENT DOCUMENTS

| | | | |
|---|---|---|---|
| 6,436,741 B2 * | 8/2002 | Sato et al. | 438/149 |
| 6,956,399 B1 * | 10/2005 | Bauer | 326/41 |
| 7,197,727 B1 * | 3/2007 | Su | 716/4 |

* cited by examiner

*Primary Examiner*—Christine T Tu
(74) *Attorney, Agent, or Firm*—W. Eric Webostad

(57) ABSTRACT

A test circuit in an integrated circuit and method of testing therewith are described. A test pattern generator provides a test pattern. A reference circuit includes a first sequential circuit coupled in series with a second sequential circuit. A circuit under test is coupled between a source sequential circuit and a destination sequential circuit to form a series. The source sequential circuit and the first sequential circuit are coupled to the test pattern generator to receive the test pattern. A comparison circuit is coupled to receive a first output from the destination sequential circuit and a second output from the second sequential circuit. The comparison circuit is configured to compare the first output with the second output to provide a signature output.

6 Claims, 7 Drawing Sheets

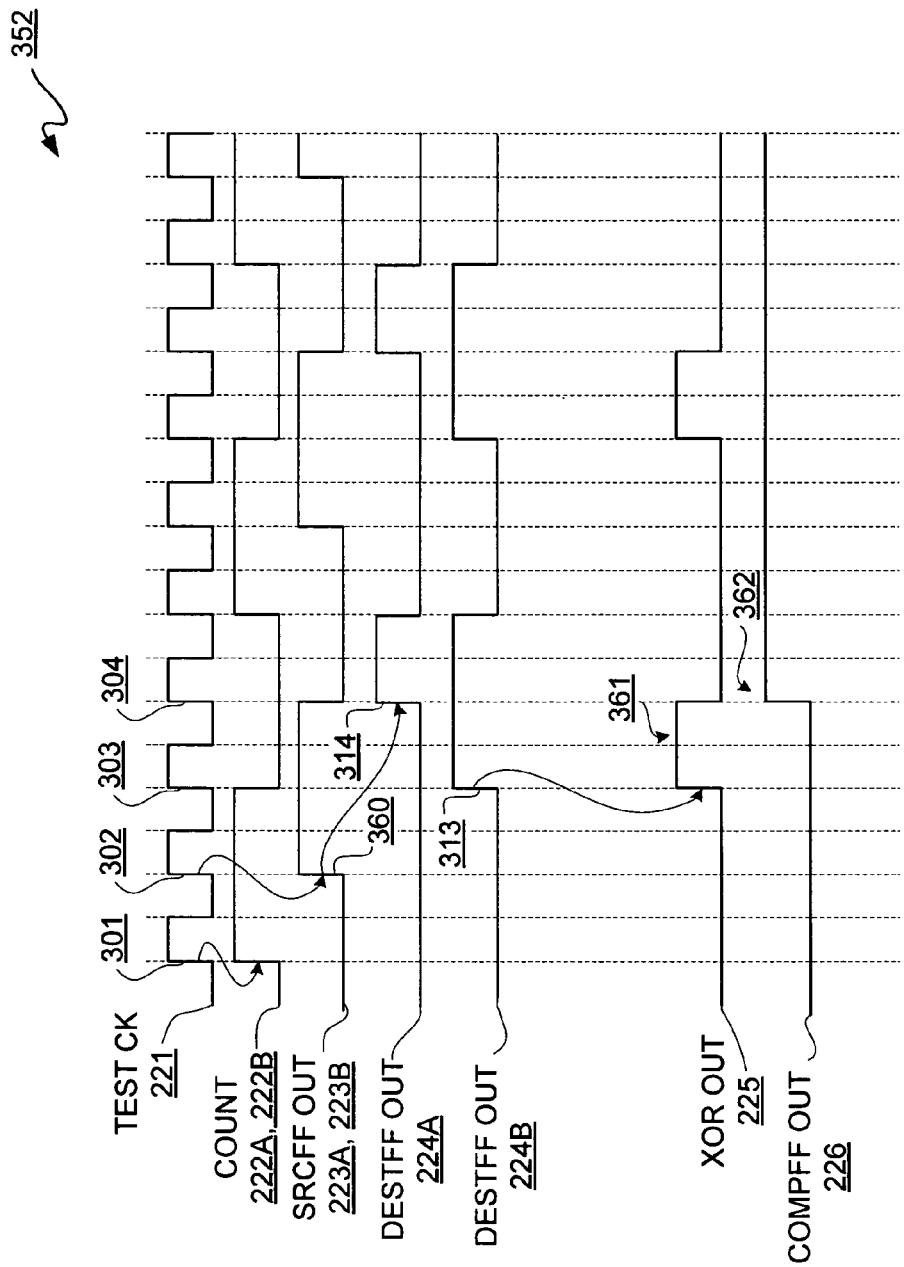

INTEGRATED CIRCUIT INTERNAL TEST CIRCUIT AND METHOD OF TESTING THEREWITH

FIELD OF THE INVENTION

One or more aspects of the invention relate generally to integrated circuits and, more particularly, to testing of integrated circuits.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, testing of performance of a design instantiated in programmable logic of an FPGA ("FPGA fabric") was premised on fully programmable parts. However, as partially programmable parts may be used for some designs, testing of such designs in an FPGA that is partially programmable has become more problematic.

Accordingly, it would be desirable and useful to provide means for testing a design implemented in a partially programmable FPGA to verify functionality of the programmable logic employed for one or more design constraints.

SUMMARY OF THE INVENTION

One or more aspects of the invention generally relate to integrated circuits and, more particularly, to testing of integrated circuits.

An aspect of the invention is a test circuit in an integrated circuit. A test pattern generator provides a test pattern. A reference circuit includes a first sequential circuit coupled in series with a second sequential circuit. Programmable interconnects are for selectively coupling a circuit under test into and out of the test circuit. The circuit under test has non-sequential logic coupled in series between a source sequential circuit and a destination sequential circuit. The source sequential circuit and the first sequential circuit are coupled to the test pattern generator to receive the test pattern. A comparison circuit is coupled to receive a first output from the destination sequential circuit and a second output from the second sequential circuit. The first sequential circuit, the second sequential circuit, the source sequential circuit, and the destination sequential circuit are clocked responsive to a test clock signal. The comparison circuit is configured to compare the first output with the second output to provide a signature output. The signature output indicates whether the test data passes through the circuit under test within a cycle of the test clock signal.

Another aspect of the invention is a method for in-line product testing of an integrated circuit. A circuit design is instantiated in programmable logic of the integrated circuit. First identification information for a first speed limiting path in the circuit design is obtained. The first speed limiting path is decoupled from the circuit design. The first speed limiting path is coupled to a test circuit in the integrated circuit. It is verified whether the first speed limiting path operates at a target frequency using the test circuit. The first speed limiting path is decoupled from the test circuit. The first speed limiting path is re-coupled to the circuit design.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 3B is a timing diagram depicting a respective exemplary embodiment of a condition where a critical path timing constraint violation occurs owing to a rising edge being too slow.

DETAILED DESCRIPTION OF THE DRAWINGS

Figure 1:
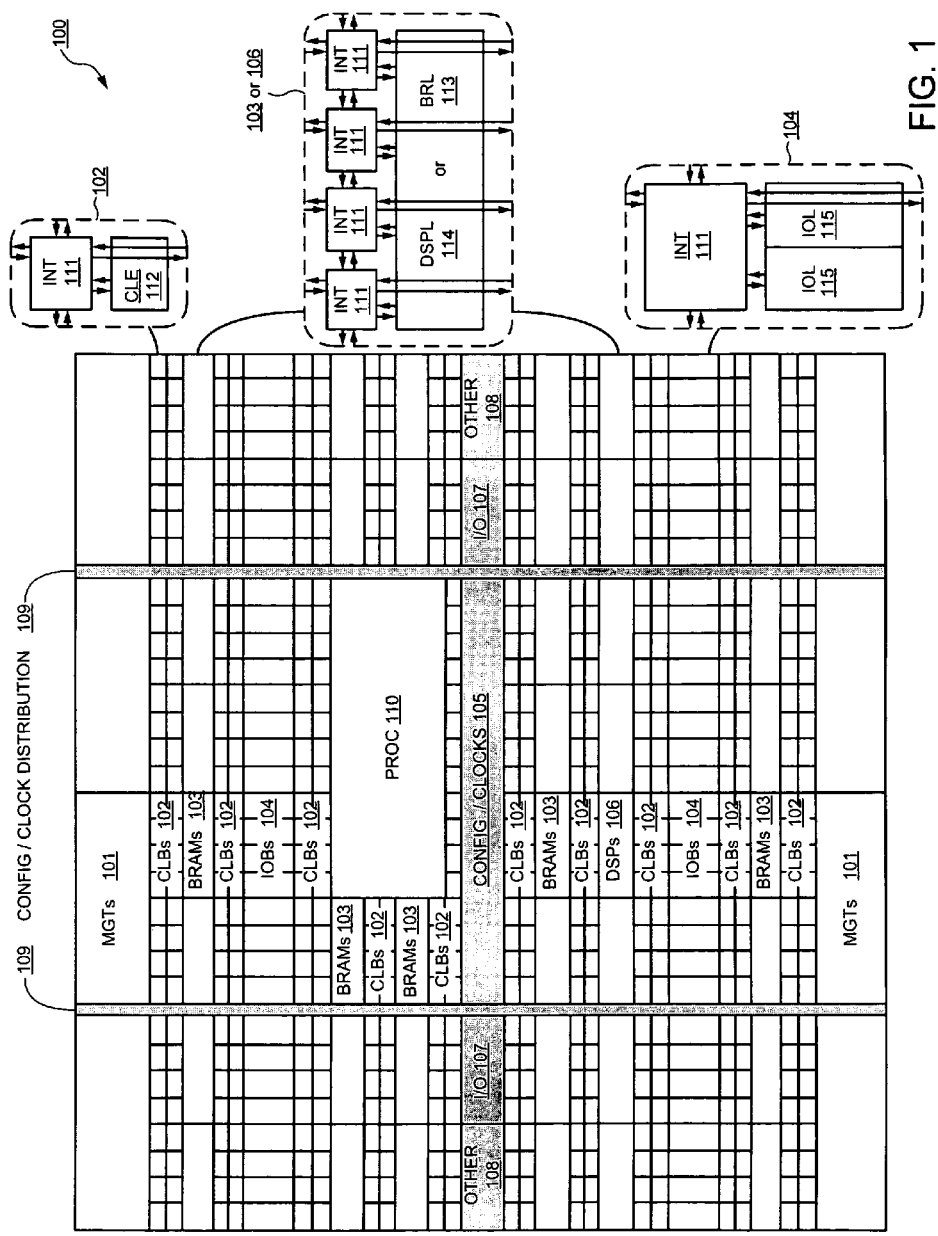
FIG. 1 is a simplified block diagram depicting an exemplary embodiment of a columnar Field Programmable Gate Array ("FPGA") architecture in which one or more aspects of the invention may be implemented.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustra- FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
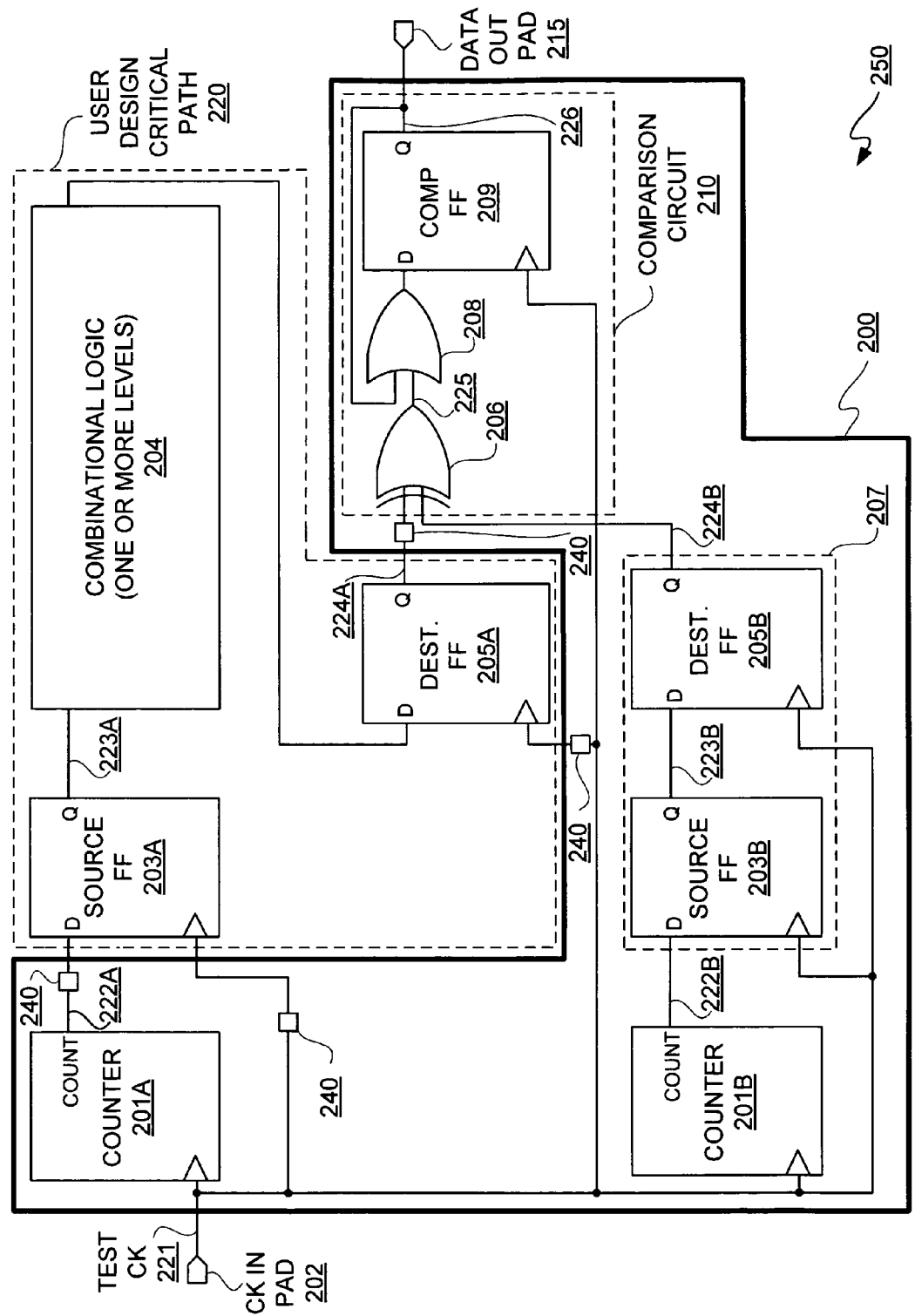
FIG. 2 is a block/schematic diagram depicting an exemplary embodiment of a test jig.

FIG. 2 is a block/schematic diagram depicting an exemplary embodiment of a test system 250. Test system 250 includes test jig 200, and test system 250 may have a user design "critical path" 220 coupled into and out of such test system 250 for electrical communication with test jig 200. As is known, a "critical path" is generally considered a speed-limiting path with respect to a frequency of operation of a user design. Test jig 200 is used to test a user design "critical path" 220.

A user design "critical path" 220 as illustratively shown includes a source flip-flop 203A and a destination flip-flop 205A, between which is located combinational logic 204. Thus, user design critical path 220 starts with a flip-flop and ends with a flip-flop. Flip-flops 203A and 205A, as well as combinational logic 204, may be in programmable logic of an FPGA and, more particularly, may be within FPGA fabric, or one or more IOBs, or any combination thereof. For example, a series of gates may be considered more than one logic level. Combinational logic 204 may be one or more levels of combinational logic. Notably, none of the circuitry in combinational logic includes clocked circuits such as flip-flops, namely sequential circuits.

As is known, a design may be tested using static timing analysis. Static timing analysis may be used to identify a critical path. Notably, there may be more than one critical path within a design to be tested. However, for purposes of clarity and not limitation, only a single critical path is described with reference to FIG. 2. After identifying a critical path in a user design, such user design critical path 220 identified may be inserted into test jig 200 to form a test system 250. This insertion may be done by programmably coupling user design critical path 220 to test jig 200 using programmable interconnect points ("PIPs") 240 of an FPGA. A static timing analysis of a user design to identify a user design critical path 220 may also be used to predict a maximum frequency of operation associated with such user design critical path 220. User design critical path 220 may be tested at this predicted maximum frequency of operation, as described below in additional detail.

A test clock signal 221 may be input to test jig 200 via a clock input pad 202. Test clock signal 221 may be set at the maximum frequency predicted by static timing analysis as previously described.

In this example, two counters, namely counters 201A and 201B of test jig 200, are used to provide a test data pattern. Notably, rather than using two counters 201A and 201B, a single counter 201A may be used, where data from counter 201A is provided as an input to both source flip-flop 203A of user design critical path 220 and source flip-flop 203B of test jig 200. However, separate counters 201A and 201B are shown as being clocked responsive to test clock signal 221 for providing respective data inputs, namely count signals 222A and 222B, to respective data input ports of source flip-flops, namely flip-flops 203A and 203B, respectively.

Source flip-flops 203A and 203B are also clocked responsive to test clock signal 221. Source flip-flop 203B is part of a reference circuit 207 of test jig 200. Reference circuit 207 includes source flip-flop 203B as well as destination flip-flop 205B. Destination flip-flop 205B and destination flip-flop 205A are each clocked responsive to test clock signal 221. It should be appreciated that flip-flops 203B and 205B may be selected to mimic flip-flops 203A and 205A respectively.

For purposes of clarity by way of example and not limitation, it shall be assumed that counters 201A and 201B are each implemented with a single stage toggle flip-flop. Thus, counters 201A and 201B effectively provide respective clock dividers for dividing test clock signal 221. However, as will be appreciated, test clock signal 221 may be provided to other types of counters or other circuitry to provide a divide-by output greater than 2. For example, a divide-by-4 output may be used. However, again, for purposes of clarity and not limitation, it shall be assumed that a divide-by-2 output is used. Additionally, it should be appreciated that other types of counters, whether implemented with a single stage flip-flop, a 2-bit Johnson counter, a binary counter, or other known form of counter, may be used. In general, any form of circuit capable of providing a test pattern as one or more data inputs may be used.

Test data 222A output from counter 201A responsive to test clock signal 221 is provided to a data input port of source flip-flop 203A. Such data provided to source flip-flop 203A is clocked out responsive to test clock signal 221 to provide test data 223A to combinational logic 204. Test data 223A is thus a source flip-flop output. Such test data 223A propagates through combinational logic 204. Output of combinational logic 204 is provided to a data input port of destination flip-flop 205A. Output of destination flip-flop 205A is test data 224A, which is clocked out of destination flip-flop 205A responsive to test clock signal 221. Test data 224A is thus a destination flip-flop output.

Test data 224A is provided to an input port of a comparison circuit 210. Notably, an exemplary implementation of a comparison circuit 210 having exclusive OR ("XOR") gate 206, OR gate 208, and comparison flip-flop 209 is illustratively shown. However, it should be appreciated from this description that any of a variety of circuit implementations may be used to provide comparison circuit 210. Additionally, it should be understood that even though a single bit path is described with respect to a user design critical path 220, multiple flip-flops in parallel, as well as multiple sets of combinational logic coupled between such flip-flops, may be tested for determining a maximum frequency from an input bus to an output bus. However, as such bus-to-bus implementation may be understood from the clarity of processing a single bit path for a user design critical path 220, the latter is used for purposes of clarity and not limitation.

In parallel with counter 201A providing test data 222A to source flip-flop 203A of user design critical path 220, counter 210B provides test data 222B to a data input port of source flip-flop 203B. Test data 222B is clocked out of source flip-flop 203B responsive to test clock signal 221 and provided to a data input port of destination flip-flop 205B as test data 223B. Test data 223B is thus a source flip-flop output. Output of destination flip-flop 205B is test data 224B, which is clocked out of destination flip-flop 205B responsive to test clock signal 221 and provided to another input port of comparison circuit 210. Test data 224B is thus a destination flip-flop output.

Test data 224A and 224B are provided to respective input ports of comparison circuit 210. In this particular example, test data 224A is provided to an input of XOR gate 206 and test data 224B is provided to another input of XOR gate 206. Output 225 of XOR gate 206 is provided to an input of OR gate 208. Output of OR gate 208 is provided to a data input port of comparison flip-flop 209. Comparison flip-flop 209 may be clocked responsive to test clock signal 221 or some other clock signal. Output of comparison flip-flop 209, namely output test data 226, is provided to a data output pad 215, and is fed back to another input of OR gate 208.

In order to avoid timing violations in test jig 200 itself, it should be appreciated that counter 201A is effectively replicated by counter 201B. Replication of counter 201A with counter 201B in this particular example may be used to prevent or reduce having long wires that may cause timing violations. Additionally, circuit paths in test jig 200 may be intentionally kept short to ensure that a user design critical path 220 is the "critical path" of test system 250.

Accordingly, it should be appreciated that an active edge, rising or falling, of test data propagating through test system 250, encounters the same number of stages and types of sequential logic, namely clocked logic, on both a test path and a reference path for arriving at comparison circuit 210. Delay owing to combinational logic 204, which as noted above combinational logic 204 does not include sequential logic, delays such active edges more than the relatively shorter delay as associated with coupling source flip-flop 203B and destination flip-flop 205B.

By setting test clock signal 221 at a maximum frequency identified by static timing analysis, such test clock frequency may be a precise reference with respect to a total time interval for an active edge to travel from source flip-flop 203A to destination flip-flop 205A in a single clock cycle. This is by definition the maximum frequency for user design critical path 220. If the circuit actually instantiated in programmable logic of an integrated circuit, such as of an FPGA, is actually fast enough to support the maximum frequency as predicted by static timing analysis, then comparison circuit 210 should indicate no failure in output test data 226. If, however, the propagation delay of the path under test, namely user design critical path 220, is slower, for either or both a rising active edge and a falling active edge, than the period associated with the maximum frequency as predicted by static timing analysis, then comparison circuit 210 would indicate a failure in output data 226. Accordingly, it should be appreciated that with a modicum of overhead, a test jig 200 may be instantiated in programmable logic or hardwired logic, or both, to test a user design critical path 220, where PIPs 240 may be used to couple a user design critical path 220 into and out of such test jig 200. Furthermore, by keeping the overhead of test jig 200 limited, the likelihood that timing or functional failures, or with a combination thereof, associated with test jig 200 itself is substantially reduced.

In order to further understand how comparison circuit 210 may detect whether a rising or a falling active edge, or both, arrives too late for valid operation of test clock signal 221 set to a maximum frequency as identified by static timing analysis, timing diagrams are described below for various conditions.

Figure 3A:
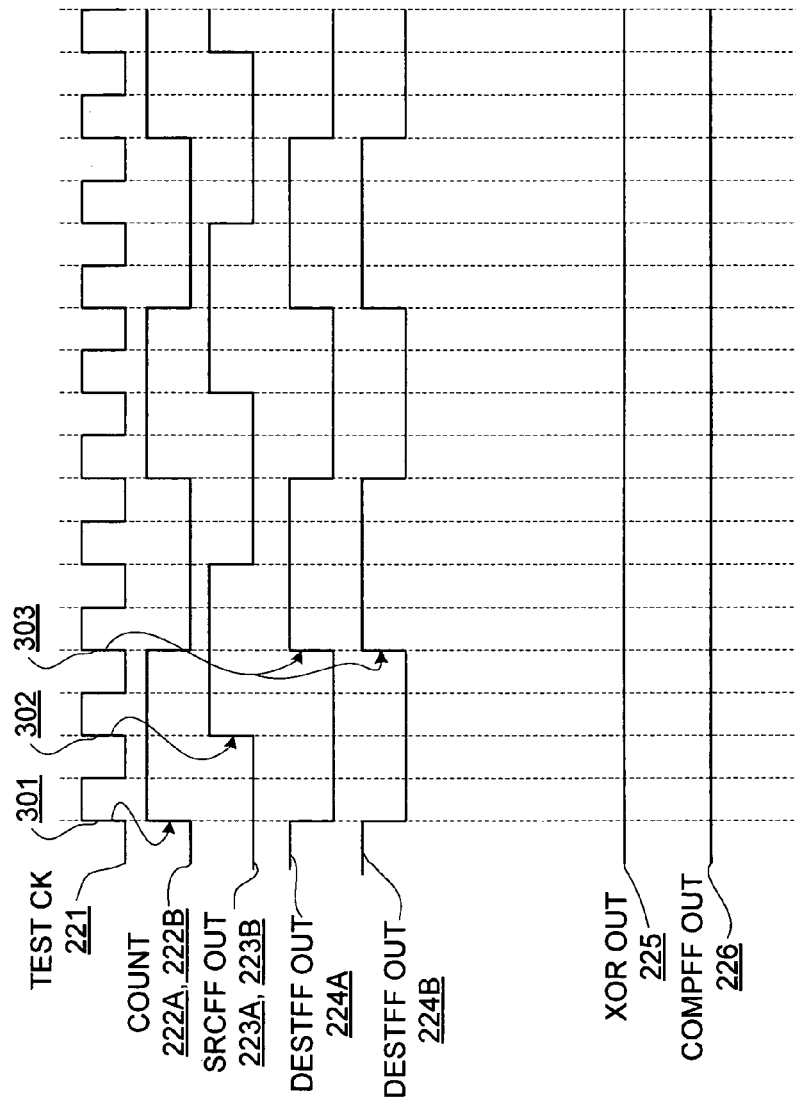
FIG. 3A is a timing diagram depicting an exemplary embodiment of a condition where a critical path delay is within or meets a timing constraint.

FIG. 3A is a timing diagram depicting an exemplary embodiment of a condition 351 where a critical path delay is within or meets a timing constraint. Notably, for purposes of clarity, all edges are shown as being aligned to edges of clock signal 221, and all edges are shown as being vertical. However, as is known, there may be some delay and slope of edges. Moreover, though a divide-by-4 operation of counters 201A and 201B is illustratively shown for purposes of clarity, it should be understood that other divisors may be used. Furthermore, initial conditions for signals, other than test clock signal 221, for all tests described with reference to FIGS. 3A through 3D are presumed to be logic low levels.

With simultaneous reference to FIGS. 2 and 3A, condition 351 is further described. Test clock signal 221 has a rising edge 301 which causes count signals 222A and 222B to transition from a logic low to a logic high state. Count signals 222A and 222B are to be synchronous, and thus for clarity only one signal trace is shown for both of such count signals 222A and 222B. Moreover, source flip-flop outputs 223A and 223B are the same signal, as each is delayed one cycle of test clock signal 221, and thus for clarity only one signal trace is shown for both of such source flip-flop output signals 223A and 223B.

Notably, it is assumed that flip-flops of FIG. 2 are rising edge-triggered. Additionally, in this example, it is assumed that for combinational logic 204, a match of inputs to XOR gate 206, namely destination flip-flop outputs 224A and 224B, indicates proper operation. However, it should be appreciated that for other instances of combinational logic 204, a mismatch of destination flip-flop outputs 224A and 224B may indicate proper operation, and accordingly comparison circuit 210 may be modified to accommodate such logic.

A rising edge 302 of test clock signal 221 on a next clock cycle causes source flip-flop outputs 223A and 223B to transition from a logic low state to a logic high state. On a next clock cycle of test clock signal 221, a rising edge 303 causes destination flip-flop outputs 224A and 224B to transition from a logic low to a logic high state. Again, continuing the example where counters 201A and 201B are implemented for divide-by-4 operation, count signals 222A and 222B, source flip-flop outputs 223A and 223B, and destination flip-flop outputs 224A and 224B accordingly will continue to transition with a 50/50 duty cycle and with a period of four clock cycles of test clock signal 221 responsive to subsequent rising edges of test clock signal 221.

It should be appreciated that for condition 351, destination flip-flop outputs 224A and 224B are at least essentially equivalent, and thus XOR output 225 will remain a logic low value. For comparison flip-flop 209 initially set to a logic 0, a logic low input to OR gate 208 from XOR gate 206, namely XOR output 225, causes input to compare flip-flop 209 to be a logic low. Thus, output test data 226 of compare flip-flop 209 will be a logic low, and this output from compare flip-flop 209 will maintain in such a logic low state. Output test data 226 is referred to hereafter as comparison flip-flop output 226 for clarity.

FIG. 3B is a timing diagram depicting an exemplary embodiment of a condition 352 where a critical path timing constraint violation occurs owing to a rising edge being "too slow," namely not propagating within a clock cycle of test clock signal 221. As much of condition 352 is similar to condition 351 of FIG. 3A, for purposes of clarity only the differences are described here with reference to FIGS. 2 and 3B. With reference to rising edge 303 of test clock signal 221, because such rising edge 303 has reached destination flip-flop 205A too late, destination flip-flop output 224A stays at an initial logic low level until a next rising edge 304 of test clock signal 221. In other words, rising edge 360 of source flip-flop output 223A is not realized by destination flip-flop output 224A until rising edge 304. As much of the remaining description involves association as between source flip-flop output 223A and destination flip-flop output 224A, reference is made to source flip-flop output 223A without also referring to source flip-flop output 223B for purposes of clarity.

It should be appreciated that after rising edge 304, destination flip-flop output 224A transitions from logic high to logic low, as previously described, because a falling edge arrives in time. Accordingly, high time of pulses of destination flip-flop output are generally cut in half as compared with normal operation as described with reference to FIG. 3A.

Notably, XOR output 225 transitions from a logic low level to a logic high level responsive to a rising edge 313 of destination flip-flop output 224B, and transitions from the logic high level back to the logic low level responsive to a rising edge of destination flip-flop output 224A to provide a pulse 361. Accordingly, XOR output 225 generates a pulse 361 every four clock cycles of test clock signal 221. One clock cycle after pulse 361 is initiated, comparison flip-flop 209 transitions to a logic high state, as generally indicated at 362. This logic high state of flip-flop output 226 is thereafter retained or "latched" for the remainder of this test.

As flip-flop output 226 transitions at 362 generally at the beginning of a fourth clock cycle of test clock signal 221, it may be determined that a rising edge does not propagate quickly enough for operating at the maximum frequency as indicated in the static timing analysis when actually applied to an integrated circuit. Notably, it should be appreciated that conventionally static timing analysis only provides a maximum frequency for a critical path, and does not delineate between rising and falling edges thereof. However, as described herein, maximum frequency with respect to rising and falling edges may be delineated from one another.

Notably, a falling edge ("logic 0") may be substantially faster than a rising edge ("logic 1"), and hence a glitch may result where the logic 0 effectively races past and forces the logic 1 back down, forming what may termed a runt or inverse logic pulse. However, such a glitch need not change the signature output of comparison flip-flop output 226.

Figure 3C:
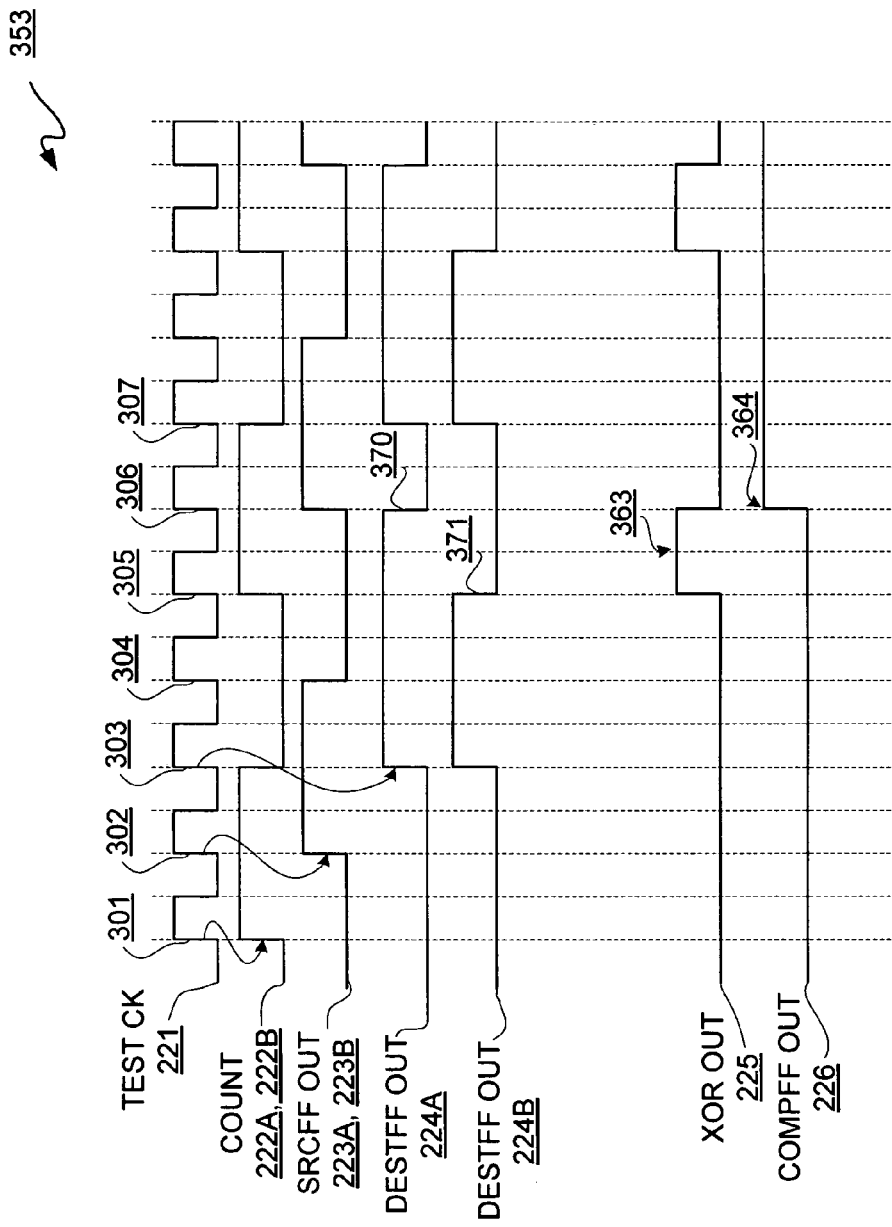
FIG. 3C is a timing diagram depicting a respective exemplary embodiment of a condition where a critical path timing constraint violation occurs owing to a falling edge being too slow.

FIG. 3C is a timing diagram depicting an exemplary embodiment of a condition 353 where a critical path timing constraint violation occurs due to a falling edge being too slow. In this example, a falling edge has not arrived to destination flip-flop 205A by the time of rising edge 305. Accordingly, destination flip-flop output 224A does not transition to a logic low state until a next rising edge, namely rising edge 306, of test clock signal 221. Thus, responsive to rising edge 304, destination flip-flop output 224A transitions from a logic high to a logic low state as indicated by falling edge 370.

As rising edges arrive in time for operating at a maximum frequency, on a next rising edge 307, destination flip-flop output 224A transitions from a logic low to a logic high state. Accordingly, logic high time is three times that of logic low time with respect to destination flip-flop output 224A for a 75/25 duty cycle. Destination flip-flop output 224A and destination flip-flop output 224B cause XOR output 225 to transition from a logic low level to a logic high level responsive to a falling edge 371 of destination flip-flop output 224B, and transition from the logic high level back to the logic low level responsive to a falling edge 370 of destination flip-flop output 224A to provide a pulse 363. Accordingly, XOR output 225 generates a pulse 363 every four clock cycles of test clock signal 221. One clock cycle after pulse 363 is initiated, comparison flip-flop 209 transitions to a logic high state generally at 364. This logic high state of comparison flip-flop output 226 is thereafter retained or "latched" for the remainder of this test.

Notably, transition 364 of condition 353 occurs two cycles of test clock signal 221 later than transition 362 of condition 352 of FIG. 3B. Thus, it should be appreciated that the signatures for a rising edge arriving late, as described with reference to FIG. 3B, and a falling edge arriving late, as described with reference to FIG. 3C, are different from one another.

Figure 3D:
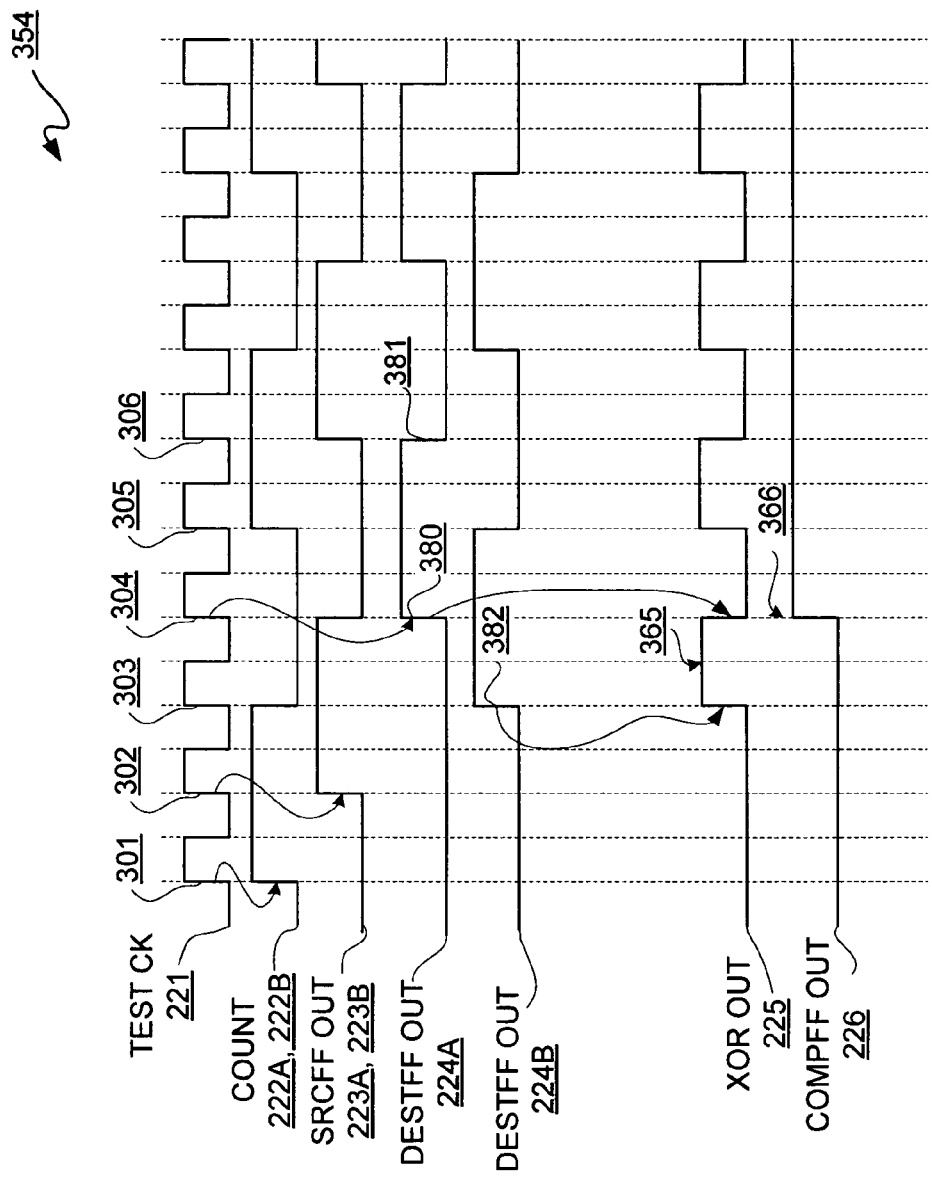
FIG. 3D is a timing diagram depicting an exemplary embodiment of a condition where critical path timing constraints have been violated for both falling and rising edges being too slow.

FIG. 3D is a timing diagram depicting an exemplary embodiment of a condition 354 where critical path timing constraints have been violated for both falling and rising edges being too slow. In this example, destination flip-flop output 224A does not receive a rising edge of source flip-flop output 223A in time for rising edge 303 of test clock signal 221. Thus, destination flip-flop output 224A does not transition from a logic low state to a logic high state until one cycle later, namely rising edge 380, which is responsive to rising edge 304 of test clock signal 221. In this example, destination flip-flop output 224A does not receive a falling edge of source flip-flop output 223A in time for rising edge 305 of test clock signal 221. Thus, destination flip-flop output 224A does not transition from a logic high state to a logic low state until one cycle later, namely rising edge 381, which is responsive to rising edge 306 of test clock signal 221. Thereafter, destination flip-flop output 224A toggles with at least approximately a 50/50 duty cycle just like destination flip-flop output 224B, except that destination flip-flop output 224A is 90 degrees delayed with respect to destination flip-flop output 224B.

In FIG. 3D, it should be appreciated that the arrival of a logic 1, namely a rising edge, of destination flip-flop output 224A is delayed by one cycle, and the arrival of a logic 0, namely a falling edge, of destination flip-flop output 224A is also delayed by one cycle. In other words, destination flip-flop output 224A has the same duty cycle as destination flip-flop output 224B; however, destination flip-flop output 224A is one cycle delayed for both rising and falling edges. Accordingly, destination flip-flop outputs 224A and 224B are 90 degrees out of phase with respect to one another.

Destination flip-flop output 224A and destination flip-flop output 224B cause XOR output 225 to transition from a logic low level to a logic high level responsive to a falling edge 382 of destination flip-flop output 224B, and transition from the logic high level back to the logic low level responsive to rising edge 380 of destination flip-flop output 224A to provide a pulse 365. Accordingly, XOR output 225 generates a pulse 365 every other clock cycle of test clock signal 221. One clock cycle after pulse 365 is initiated, comparison flip-flop 209 initiates a transition to a logic high state generally at 366. This logic high state of comparison flip-flop output 226 is thereafter retained or "latched" for the remainder of this test.

Notably, comparison flip-flop output 226 is the same signature in both FIGS. 3B and 3D, namely a logic 1 is latched beginning generally at the beginning of the fourth clock cycle of test clock signal 221. However, XOR output 225 is different in FIGS. 3B and 3D, and thus by looking at both signals 225 and 226, it may be determined what the failure condition is. Thus, the signatures in FIGS. 3A through 3D by using only signals 225 and 226 for example are four different signatures. By having different signatures, a determination may be made as between proper operation, a slow rising edge, a slow falling edge, and slow rising and falling edges, as shown in the examples of FIGS. 3A through 3D, respectively.

Figure 4:
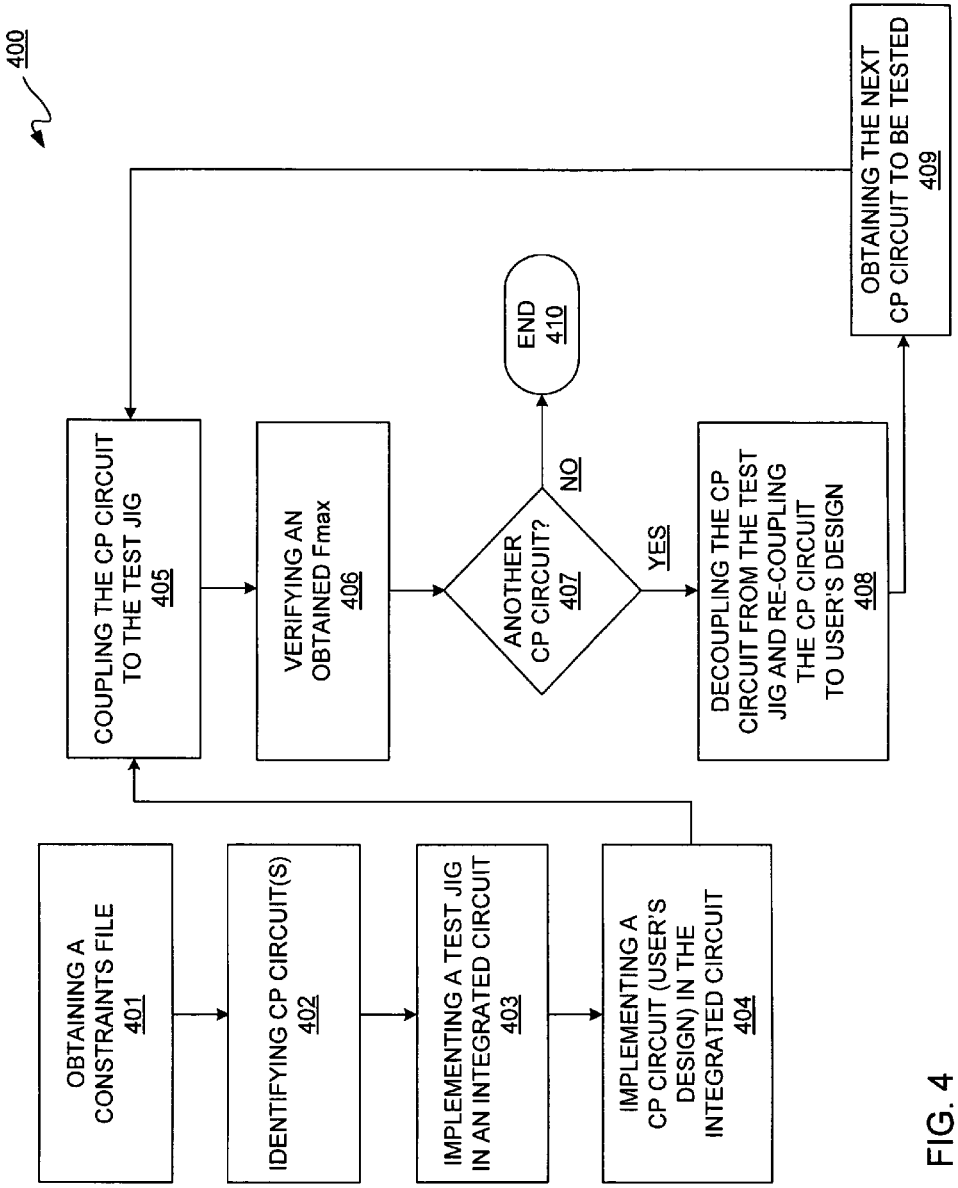
FIG. 4 is a flow diagram depicting an exemplary embodiment of a path timing testing flow.

FIG. 4 is a flow diagram depicting an exemplary embodiment of a path timing testing flow 400. Notably, path timing testing flow 400 may be used for in-line production for verification of path speed at an operating frequency, which may include a maximum frequency of operation. Notably, because test jig 200 of FIG. 2 has very little overhead, such testing may be used for in-line production. More particularly, an FPGA which may be suboptimal or otherwise defective may be tested to verify a user design operates as intended in spite of defects. Thus, FPGAs having partial or suboptimal functionality may be used for some customers' designs, provided that operation may be verified. For example, for a user circuit design ready for volume production and not requiring full functionality, such as speed or programmability or both, of an integrated circuit, such as a PLD or any integrated circuit with sufficient programmable logic, test system 250 of FIG. 2 may be used as described herein for in-line production.

With continuing reference to FIG. 4, a constraints file for a user design is obtained at 401. At 402, from the constraints file at 401, one or more critical path ("CP") circuits are identified. Notably, a user may indicate which circuits are to be considered CP circuits without necessarily having to provide a constraints file 401.

At 403, a test jig, such as test jig 200 of FIG. 2, is implemented in an integrated circuit. This implementation may involve programmable logic or hardwired logic, or a combination thereof. At 404, a CP circuit as identified at 402 is implemented in the integrated circuit. It should be appreciated that at 404, implementing a CP circuit in an integrated circuit may involve instantiating a user design in the integrated circuit. Notably, the integrated circuit need not be a PLD, but may be an integrated circuit having programmable logic for implementing at least a portion of a user design, including one or more CP circuits. At 405, the CP circuit implemented at 404 is coupled to the test jig implemented at 403.

At 406, a maximum frequency of operation, such as may be provided by a user or obtained from static timing analysis, is verified by testing operation of the CP circuit implemented at 404 at such maximum frequency. Notably, data output from 406 may indicate both rising and falling edges do not violate timing constraints, or both rising and falling edges do violate timing constraints, or a rising edge violates a timing constraint, or a falling edge violates a timing constraint.

At 407, it is determined whether there is another CP circuit to be tested. If no other CP circuit is to be tested, path timing testing flow 400 may end at 410. If, however, another CP circuit is to be tested, then at 408, the currently implemented CP circuit is decoupled from the test jig and re-coupled to the user instantiated design. At 409, the next CP circuit to be tested, namely a next CP circuit of the CP circuits identified at 402, is obtained. Such next CP circuit to be tested is coupled to the test jig at 405.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for in-line product testing of an integrated circuit, comprising:
   instantiating a circuit design in programmable logic of the integrated circuit;
   obtaining first identification information for a first speed limiting path in the circuit design;
   decoupling the first speed limiting path from the circuit design;
   coupling the first speed limiting path to a test circuit in the integrated circuit;
   verifying whether the first speed limiting path operates at a target frequency using the test circuit;
   decoupling the first speed limiting path from the test circuit; and
   re-coupling the first speed limiting path to the circuit design.

2. The method according to claim 1, further comprising instantiating the test circuit in the programmable logic of the integrated circuit.

3. The method according to claim 1, further comprising:
   obtaining second identification information for a second speed limiting path in the circuit design;
   decoupling the second speed limiting path from the circuit design;
   coupling the second speed limiting path to a test circuit in the integrated circuit;
   verifying whether the second speed limiting path operates at a target frequency using the test circuit;
   decoupling the second speed limiting path from the test circuit; and
   re-coupling the second speed limiting path to the circuit design.

4. The method according to claim 3, wherein the integrated circuit is a programmable logic device.

5. The method according to claim 4, wherein the circuit design is ready for volume production, and wherein the circuit design does not require full programmability of the programmable logic device.

6. The method according to claim 5, wherein the programmable logic device is a partially programmable version of the programmable logic device.

* * * * *